(12) United States Patent
Prokofiev et al.

(10) Patent No.: US 7,209,366 B2
(45) Date of Patent: Apr. 24, 2007

(54) DELIVERY REGIONS FOR POWER, GROUND AND I/O SIGNAL PATHS IN AN IC PACKAGE

(75) Inventors: Victor Prokofiev, Phoenix, AZ (US); Cengiz A. Palanduz, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 264 days.

(21) Appl. No.: 10/804,800

(22) Filed: Mar. 19, 2004

(65) Prior Publication Data

US 2005/0207131 A1    Sep. 22, 2005

(51) Int. Cl.
*H05K 1/11* (2006.01)
(52) U.S. Cl. .............. 361/803; 361/782; 361/783; 257/691; 174/534; 174/520
(58) Field of Classification Search ........... 361/803, 361/782, 783; 257/691; 174/534, 520
See application file for complete search history.

(56) References Cited

U.S. PATENT DOCUMENTS 4,677,741 A    7/1987    Takahama
5,070,382 A    12/1991   Cambou
6,115,255 A    9/2000    Iovdalsky
6,521,982 B1   2/2003    Crowley et al.
2002/0029906 A1*  3/2002  Echigo et al.
2003/0147226 A1*  8/2003  Devey
2003/0156400 A1*  8/2003  Dibene, II et al.
2003/0198033 A1* 10/2003  Panella et al.
2005/0141206 A1*  6/2005  Radhakrishnan et al.

* cited by examiner

*Primary Examiner*—Tuan Dinh
*Assistant Examiner*—Yuriy Semenenko
(74) *Attorney, Agent, or Firm*—Schwabe, Williamson & Wyatt, P.C.

(57) ABSTRACT

An integrated circuit (IC) package includes a chip carrier and a chip mounted to the chip carrier. The chip carrier has a centrally located power delivery region and a peripherally located input-output (I/O) delivery region disposed in partially surrounding relationship to the power delivery region. Power and ground paths are disposed in the power delivery region and I/O signal paths are disposed in the I/O delivery region.

20 Claims, 4 Drawing Sheets

DELIVERY REGIONS FOR POWER, GROUND AND I/O SIGNAL PATHS IN AN IC PACKAGE

BACKGROUND OF THE INVENTION

1. Field of the Invention

The present invention relates to electronic devices, and in particular, to integrated circuit packages.

2. Description of Related Art

An integrated circuit (IC) package includes a chip carrier and a silicon die or chip mounted in the chip carrier, such chip including an integrated circuit. The IC package provides the means to bring input/output (I/O) signals and a voltage supply in and out of the chip. Generally, there are two interconnection levels of the IC package: the chip to the chip carrier and the chip carrier to a substrate or printed circuit board (PCB). The IC package may be directly coupled to the PCB or indirectly coupled to the PCB through a socket so that the IC package is removable.

As semiconductor chips and other devices are required to perform more functions or operations in shorter periods of time, power and signal requirements for chips are increasing. High speed performance chips, operating at low voltages, have higher current and power requirements. The higher power requirements require more power and ground paths that take up more area in the chip carrier and socket, causing difficulties in delivering stable power to the chip. Additionally, the increased I/O signal requirements call for additional I/O signal paths that compete with the increased number of power and ground paths for area in the chip carrier and socket.

One difficulty with these high performance chips is the close proximity of the power paths and I/O signal paths in the IC packages and sockets, which may result in electromagnetic interference in delivering error free signaling. Another difficulty is the high inductance and resistance of the power and ground paths. For example, a fast increase in the current drawn by the processor chip may cause a drop in the power supply voltage, since the high rate of change in current is through the inductance of the chip carrier and the socket. This is referred to as a power supply voltage droop. Improving power delivery performance, e.g., reducing voltage drop, has been accomplished by placing decoupling capacitors on the top of the chip carrier surrounding the chip and by connecting them to internal power and ground distribution planes within the chip carrier.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 1:
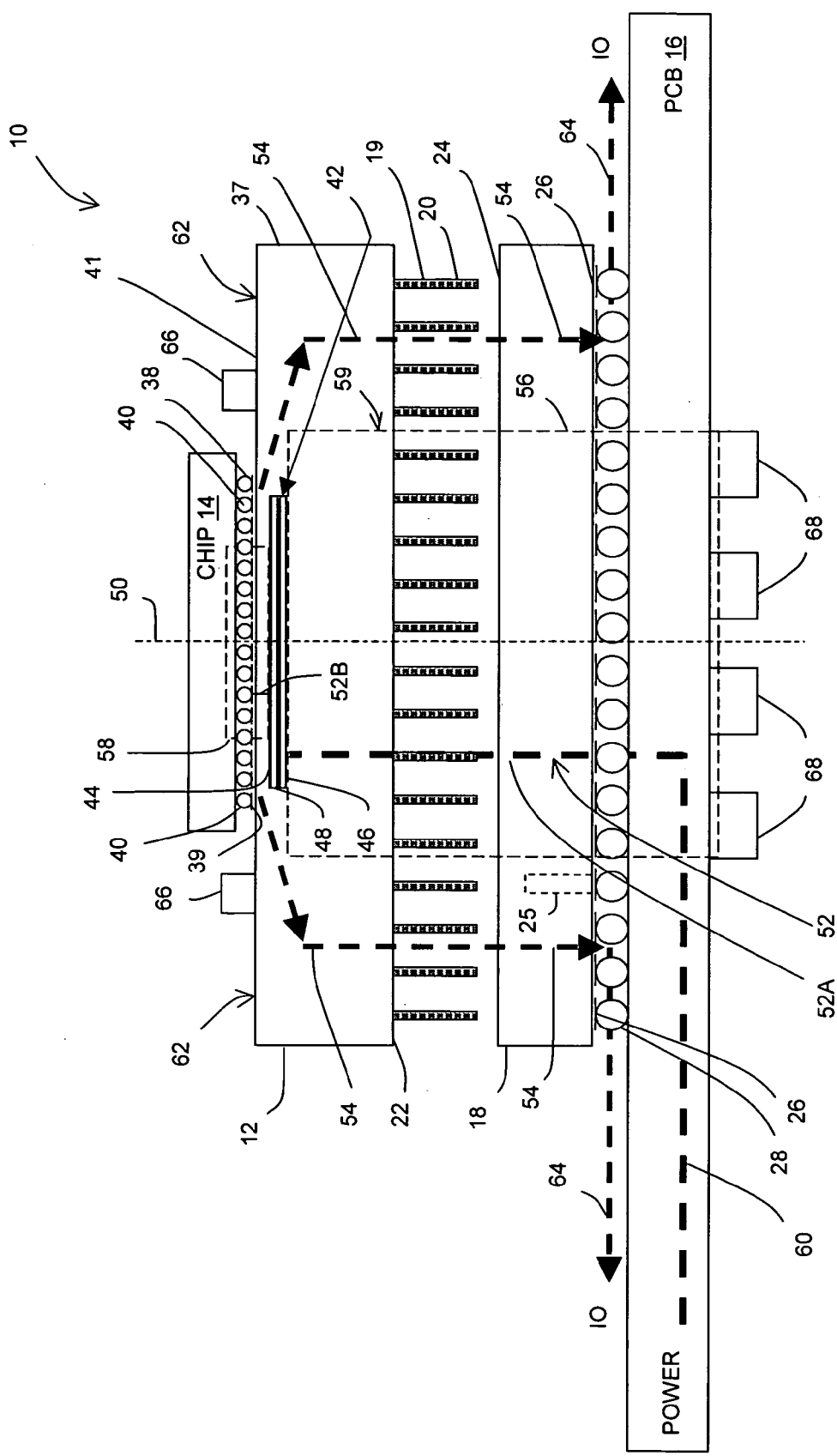
FIG. 1 shows a side view of an electronic assembly in accordance with one embodiment of the present invention.

Referring to FIG. 1, there is shown an electronic assembly 10 in accordance to one embodiment of the present invention. The electronic assembly 10 may include an integrated circuit (IC) package 12 having mounted therein a silicon chip or die 14 containing an IC, a substrate or printed circuit board (PCB) 16, and a socket 18 mounted between the IC package 12 and the PCB 16 (package 12 is shown detached from socket 18 in FIG. 1). Although the socket 18 is shown in FIG. 1, in some embodiments according to the present invention, the socket 18 may be eliminated and the IC package 12 may be directly mounted to the PCB 16. As will be described in more detail below, electronic assembly 10 may include a novel power and I/O delivery region arrangement. In various embodiments, electronic assembly 10 may also include a novel employment of decoupling capacitor and a flexible thin board.

With reference to FIG. 1, the IC package 12 is shown as a pin-grid-array (PGA) package that has an array of external, land-side contacts 19, in the form of metal pins 20 protruding from a land side 22 of the IC package. These pins 20 are dedicated to power, ground, or I/O signals. I/O signals may include data signals, address signals, control signals and/or other low current/slow signals. However, the IC package 12 may take other forms, such as a ball grid array (BGA) package in which the array of land-side contacts 19 may take the form of an array of conductive land pads for connection via solder balls.

As shown in FIG. 1, the electronic assembly 10 may include the socket 18. In the embodiment wherein the IC package 12 comprises a PGA package, the socket 18 may be a PGA socket. This embodiment of the IC package 12 may be electrically connected to the socket 18 through its metal pins 20 (i.e., land-side contacts 19), with the pins 20 being inserted into a matrix of holes (not shown) in an upper surface 24 of the socket 18 to engage a matrix of socket connectors 25. There is one socket connector 25 configured and aligned to receive each of the pins 20. However, in FIG. 1 only one complete socket connector 25 is shown with dashed lines, with only the lower portions of the other socket connectors 25 being visible on a bottom surface 26 of the socket 18. In the alternative embodiment wherein the IC package 12 comprises a BGA package (not shown), the socket 18 may comprise a land grid array (LGA) socket. In this alternative embodiment, the BGA package may electrically connect to the LGA socket by the land pads (i.e., land side contacts 19) engaging an array of the socket connectors slightly extending above an upper surface of the LGA socket. Regardless of whether the socket 18 is a PGA or LGA socket, the plurality of socket connectors connect the socket 18 to the PCB 16. In FIG. 1 this connection to the PCB 16 is accomplished via a plurality of solder balls 28. In summary, the socket 18 provides electrical connections between the IC package 12 and the PCB 16 by way of the array of socket connectors 25 traversing the socket 18.

In the alternative embodiment in accordance with the present invention where the socket 18 is not included, the IC package 12 may be electrically coupled directly to the PCB 16 by the land-side contacts 19. For example, in the embodiment where the IC package 12 is a PGA package, the IC package may be directly mounted by the plurality of pins 20 (i.e., land-side contacts 19) to the PCB 16 using pass-through mounting. In the embodiment where the IC package 12 is a BGA package, the IC package 12 may be directly mounted by the plurality of land pads (i.e., land-side contacts 19) to the PCB 16 by solder balls.

Figure 2:
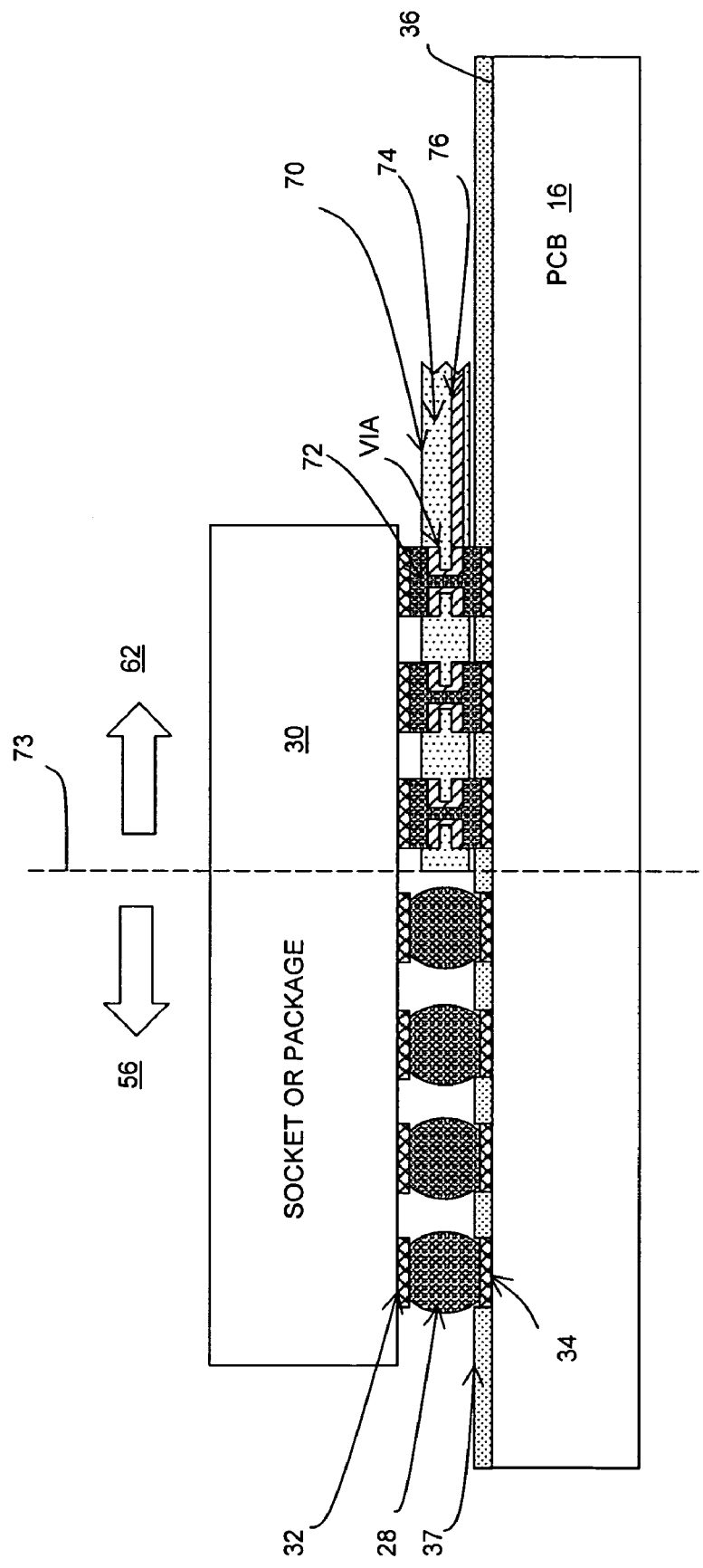
FIG. 2 shows a generic representation of an electronic assembly of FIG. 1, with and without a socket, in accordance with one embodiment of the present invention.

Referring to FIG. 2, the block 30 is a generic representation of the embodiments having and not having the socket 18. In other words, the block 30 may represent the socket 18 of FIG. 1 when included or the package 12 of FIG. 1 when the socket 18 is not included. In either embodiment, the block 30 may have a plurality of conductive land pads 32 connected by the solder balls 28 to a plurality of conductive board pads 34 mounted on the upper surface 36 of the PCB 16. A solder mask 37 may comprise a coating that has been applied over selected areas of the PCB 16, such that only uncoated areas are soldered (e.g., the board pads 34).

Referring back to FIG. 1, the IC package 12 includes a chip carrier 37 to which the IC chip 14 is mounted. The chip 14 may have a plurality of bond pads (not shown) and the chip carrier 37 may have a plurality of chip-side contacts 38. These chip-side contacts 38 may take the form of a plurality of carrier pads 39. The electrical interconnection between the chip-side contacts 38 and the bond pads of the chip 14 may be accomplished by a plurality of solder bumps 40. The chip-side contacts 38 are located on a chip side 41 of the chip carrier 37. The chip 14 may be mounted to the chip carrier 37 using flip-chip mounting, for example.

The IC package 12 may further include an embedded decoupling capacitor 42 positioned in close proximity to the chip 14. The decoupling capacitor 42 may include a pair of parallel conductive ground and power layers 44 and 46 separated by a dielectric layer 48. This pattern of power, ground, and dielectric layers may be repeated multiple times, depending on the capacitance needs. The chip 14, chip carrier 37, the socket 18, and the capacitor 42 may have a common center axis 50. The IC package 12 may have internal routing layers (not shown) which couple the land-side contacts 19 (e.g., pins 20) on the land side 22 to the chip-side contacts 38 (e.g., carrier pads 39) on the chip side 41 of the chip carrier 37. This internal routing of the IC package 12 may include separate layers for a ground bus, a power bus and a plurality of I/O signal lines. The various layers may be coupled to the land-side contact 19 and the chip-side contacts 38 by vias (not shown) that extend through the IC package 12. In the case where the chip 14 comprises a microprocessor chip, different power voltage levels may be provided (e.g., one voltage for the processor core section and one voltage for I/O section). In this embodiment, the package 12 may have two different power busses to accommodate the different voltage levels.

Referring back to FIGS. 1 and 2, the electronic assembly 10 defines a plurality of electrical paths between the PCB 16 and the chip 14, such electrical paths including power and ground paths 52 for voltage supply (e.g., pairs of power and ground paths) and input/output (I/O) signal paths 54 for data signals. Only one of the plurality of power and ground paths 52 and two of the plurality of I/O signal paths 54 are illustrated with dashed lines in FIG. 1. Each of the power and ground paths 52 may be formed by serially connected elements of the electronic assembly 10, which may include one of the solder bumps 40; one of the chip-side contact 38 on the chip carrier 37; internal interconnect elements of the chip carrier 37 including a power or ground bus or layer (not shown), the power or ground plate 44 or 46 of the capacitor 42, and vias (not shown) interconnecting the power or ground bus, capacitor plate, the chip-side contact 38 and one of the land-side contacts 19; the land-side contact 19, one of the socket connectors 25 in the socket 18, one of the land pads 32, one of the solder balls 28, and one of the board pads 34. Each of the I/O signal paths 54 may be formed by serially connected elements, which may include one of the solder bumps 40; one of the chip-side contacts 38 on the chip carrier 37; internal interconnect elements of the chip carrier 37 including at least one trace on at least one internal routing layer (not shown) and vias (not shown) interconnecting the trace, the chip-side contact 38, and one of the land-side contacts 19; the land-side contact 19, one of the socket connectors 25 in the socket 18, one of the land pads 32, one of the solder balls 28, and one of the board pads 34. These power/ground paths 52 and I/O signal paths 54 may have fewer serially connected elements when the socket 18 is not included.

The power/ground paths 52 may connect with a supply voltage plane (not shown) and a ground plane (not shown) in the PCB 16 and, in some embodiments, the I/O signal paths 54 may connect with circuit traces in routing layers (not shown) in the PCB 16. In general, the PCB 16 may act as a medium to supply the supply voltage, ground, and, in some embodiments, all or part of the I/O signals to chip 14. The power, ground, and other signals are supplied through traces or planes on or within chip 14, IC package 12 and PCB 16, which generally are not illustrated in the FIGS. As will be discussed with respect to FIG. 2, all or part of the I/O signals may be diverted to a flexible thin board, i.e., a second PCB.

Referring to FIG. 1, the electronic assembly 10, in accordance with one embodiment of the invention, segregates the power/ground paths 52 from the I/O signal paths 54 by centrally locating the power/ground paths 52 about the center axis 50 in a centralized power delivery region. The I/O signal paths are located outside of the centralized power delivery region in a peripheral I/O region. More specifically, the power/ground paths 52 may be routed from the solder balls 28 to the capacitor 42 through a centrally located, first power delivery zone 56. The power/ground paths 52 then may be routed from the capacitor 42 to the solder bumps 40 through a centrally located, second power delivery zone 58. The first and second power delivery zones 56 and 58 may be centered on the common center axis 50. Collectively, the first and second power delivery zones 56 and 58 are identified as the power delivery region 59, such region 59 including both the zones 56 and 58.

In the illustrative example of FIG. 1, the chip 14, IC package 12, socket 18 and the first and second power delivery zones 56 and 58 may have square cross-sectional configurations centered on the common axis 50, such cross-sectional configurations being perpendicular to the center axis 50. Configurations other than square are possible. The second delivery zone 58 may have a smaller cross-sectional configuration than the first power delivery zone 56. The power/ground paths 52 are focused or concentrated in these centrally disposed first and second power delivery zones 56 and 58, with the I/O signal paths 54 being disposed outside of these zones 56 and 58. The portions of the power/ground path 52 contained within the first power delivery zone 56 are identified as first power/ground path segments 52A and the portions of the power/ground paths 52 contained within the second power delivery zone 58 are identified as second power/ground path segments 52B. Only one pair of segments 52A and 52B is illustrated in FIG. 1, such pair may be a power path or a ground path. The routing of the power supply (power and ground) through planes (not shown) of the PCB 16 is shown by dashed path 60, such power supply being electrically coupled to the plurality of first power/ground path segments 52A (only one such coupling shown in FIG. 1). The centralizing of the power/ground paths 52 with respect to the center axis 50 may result in the power/ground paths 52 forming the shortest possible power connect path between the PCB 16 and the chip 14.

The I/O signal paths 54 are routed through a peripherally located, I/O delivery region 62. The routing of the I/O signals from the I/O delivery region 62 is generally illustrated by the arrows 64, which will be described in detail with respect to FIG. 2. The I/O delivery region 62 laterally adjacent to the first power delivery zone 56 may be defined to have a square, tubular, cross sectional configuration terminating at its inner edges on the contiguous outer edges of the first power delivery zone 56. Additionally, the I/O delivery region 62 also extends over the top of the first power delivery zone 56 to surround the second power delivery zone 58. Consequently, each I/O path 54 starts with one of the solder balls 28 in the I/O delivery region 62 laterally adjacent to the first power delivery zone 56 and each I/O path 54 terminates with one of the solder bumps 40 also in the I/O delivery region 62, but laterally adjacent to the second power delivery zone 58. In general, the I/O delivery region 62 forms a ring-like configuration around the first and second power delivery zones 56 and 58.

In an alternative embodiment where the capacitor 42 is positioned elsewhere (e.g., upper surface of the IC carrier 38), the first and second power zones 56 and 58 may be reduced to a single power delivery region. Additionally, the number of solder bumps 40 contained in the second power delivery zone 58 may equal the number of solder balls 28 in the first power delivery zone 56, with each power/ground path 52 beginning with one of the solder balls 28 and ending with one of the solder bumps 40. However, there may be a greater number of solder bumps 40 than solder balls 28; hence, a greater number of chip-side contacts 38, solder bumps 40 and vias connecting the same to the capacitor 42 in the second delivery zone 58 than the number of die side contacts 19 and vias connecting the same to the capacitor 42 in the first delivery zone 56.

Referring to FIG. 1, the employment of a relatively small power delivery region 59 and the segregation of the power paths 52 from the I/O signal paths 54 in the electronic assembly 10, in accordance to one embodiment of the present invention, may provide a number of advantages. First, the relatively small power delivery region 59 of the electronic assembly 10 may reduce resistance and inductance between the land-side contacts 19 (e.g., pins 20) of the IC package 12. To achieve lower resistance of lateral conductive planes of IC packages in some prior art designs, it may be necessary to significantly increase the thickness of these planes to reduce resistance. This increased thickness of the prior art designs in turn may increase the coefficient of thermal expansion (CTE) mismatch between the chip and the chip carrier, which undesirably reduces thermal transfer. As previously described, the power/ground paths 52 provide the shortest possible power/ground connect path between the PCB 16 and the chip 14. Providing the shortest possible paths in turn may assist in reducing the size of the power delivery region 59. In general, this architecture may reduce the extent to which the power delivery system is a bottleneck to the electronic assembly 10, allowing for an increase in current and power.

Additionally, in the electronic assembly 10 a more uniform current distribution may be provided to the chip 14 in meeting a maximum current requirement (Imax). In some prior art designs, the power is provided to more distributed and random areas than the relatively small, focused power delivery zones 56 and 58. As a result of this defocused distribution, hot spots may be generated in the chip 14, i.e., areas with high currents and areas with low currents. Some locations may be more likely to have current overloads. This is particularly an issue where the chip 14 is a microprocessor, in that the current and power requirements are relatively high.

Additionally, as will be described in more detail with respect to FIG. 4, the electronic assembly 10, by having a relatively small power delivery region 59, may substantially reduce power voltage ripple due to good superposition of all phases generated by a multi-phase voltage regulator shown in FIG. 4. The multiple phases of the supply voltage are provided by the voltage regulator to a single node, which is the focused power delivery zone 56, prior to the power being provided to the chip 14. The power delivery zones 56, in comparison with the more distributed node of some prior art designs, may provide for better integration of the multiple phases and thereby may reduce voltage ripple. Hence, the decoupling capacitors, such as the capacitor 42, may be more effective in filtering out the voltage ripple noise.

Additionally, by segregating the power/ground paths 52 and I/O signal paths 54 in the electronic assembly 10, the paths 52 and 54 may not cross each other and thereby improve I/O signal quality. Moreover, by segregating the paths 52 and 54 and placing the I/O connectors in the peripheral I/O delivery region 62, the average spacing between the I/O signal paths 54 and the nearest power path 52 may be substantially increased so as to further improve I/O signal quality. In general, segregating the I/O signal paths may reduce noise in the I/O signals.

Also, another I/O signaling performance advantage for the electronic assembly 10 may be the flexibility of the I/O void placement in the conductive planes in the peripheral I/O delivery region 62, such voids being placed around vias (not shown) used for passage of I/O connections through the IC package 12. Providing the flexibility of having large voids (not shown) in the planes of the IC package 12 around vias for the I/O signal paths 54 may allow for impedance control. In some prior art designs with I/O signal paths and power/ground paths being intermixed, high speed I/O performance was limited as a result of the power delivery system requirements of keeping solid planes intact and therefore not allowing large voids around I/O signal visas. Moreover, with high-speed processors, the number of I/O signal paths may be in the hundreds, making the inclusion of voids in areas of intermixed power and I/O signal paths, such as is undertaken in the prior art, even more of a problem in having an effective power plane in the IC package. Also, by having the I/O signal paths 54 segregated so as to be located in the I/O delivery region 62, improved crosstalk control may be possible due to the ability to provide additional spacing between I/O signal paths 54 themselves in this peripheral I/O delivery region.

By concentrating the power and ground connectors 52 in the power delivery region 59 of the electronic assembly 10, an improved thermal path for heat may be provided downward through the IC package 12 and the socket 18. Additionally, in the embodiments where the IC socket 18 is used, it may be a full grid array socket, providing metal-on-metal contact and allowing for the thermal transfer to efficiently continue to the PCB 16. This arrangement is contrary to some prior art designs wherein an air gap is created by a cavity formed in the land side of the IC package, such cavity sometimes having discrete decoupling capacitors therein. Such air gaps reduce the thermal transfer in this direction. As a related advantage, the formation of the power delivery region 59 in the electronic assembly 10 may not interfere with placement of an integrated heat spreader (not shown). More specifically, a heat sink (not shown) may be placed in contact with the chip 14 for removing heat. For higher-power devices, the integrated heat spreader (IHS) may be placed between the heat sink and the chip 14 to facilitate cooling of the chip 14.

Referring to FIG. 1, the decoupling capacitor 42 may be interposed adjacent to the chip 14 as previously described. More specifically, the capacitor 42 may be inserted between the first and second power delivery zones 56 and 58 and become part of the power delivery region 59, with the capacitor 42 and chip 14 being coaxially aligned on the same center axis 50. This positioning places the capacitor 42 in close proximity to the chip 14. The capacitor 42 may be formed by providing additional layers to the IC package 12, such layers including the conductive layers 44 and 46 and the dielectric layer 48. The dielectric layer 48 may comprise a hi-k dielectric thin film layer. This embedded capacitor 42 may be distributed across relatively large area, in addition to being in close proximity to the chip 14. The capacitor 42 may assist in maintaining a steady power supply, i.e., reduce voltage droop. The decoupling capacitor 42 serves as charge buffer, sinking current during a positive voltage spike and supplying current during a negative voltage spike. The size (area) of the capacitor 42 required increases with an increased rate of change of power supply current and increased package inductance for a given voltage droop. Hence, the capacitor 42 may provide a capacitor of substantial area, without increasing the chip area, in close proximity with the chip 14. To supplement the capacitor 42, a plurality of decoupling capacitors 66 may be mounted on the chip side 41 of the IC package 12 for compensating for secondary voltage droop. Also, a plurality of board capacitors 68 may be mounted on the bottom of the PCB 16.

The I/O signals, like the power, may be routed through the PCB 16 utilizing standard routing. Referring to FIG. 2, an alternative embodiment in accordance with the present invention is shown wherein all of the I/O signals or part of the I/O signals, may be routed through a thin flexible board or tape (thin board) 70, whereas power and ground paths may be routed on the PCB 16. In some embodiments, due to costs, it may be desirable to include part of the I/O signals on the thin board 70 and part of the I/O signals in the PCB 16.

Generally, current practice in industry is to use low quality PCBs with motherboards. To accommodate signals that are transmitted at relatively high rates, such as from a microprocessor to a chip set, the PCB 16 of FIG. 2 may need to be of high quality. For example, the PCB 16 may need to be formed using a higher-quality (e.g., more homogeneous) insulating medium or "dielectric material" than is commonly used in the industry. In addition, traces and through-holes (e.g., "vias") that are used to connect conductors on different sides or layers of the PCB 16 may need to be formed with increased accuracy. As a result, the cost of the PCB 16 may be increased and/or high-volume manufacturing may be impractical. Hence, use of the thin board 70, in conjunction with the PCB 16, may provide a lower cost alternative to use of a high-quality PCB 16. Instead, the PCB 16 may be manufactured using a lower-quality dielectric material while the thin board 70 may be manufactured using a higher-quality (e.g., more homogeneous) dielectric material. The higher-quality dielectric material may, for example, improve skew and dispersion characteristics of the thin board 70, allowing for higher-speed signaling as compared to the PCB 16. As one example, the dielectric material used for the higher quality portion 220 may comprise KAPTON® polyimide film available from DUPONT®.

Figure 3:
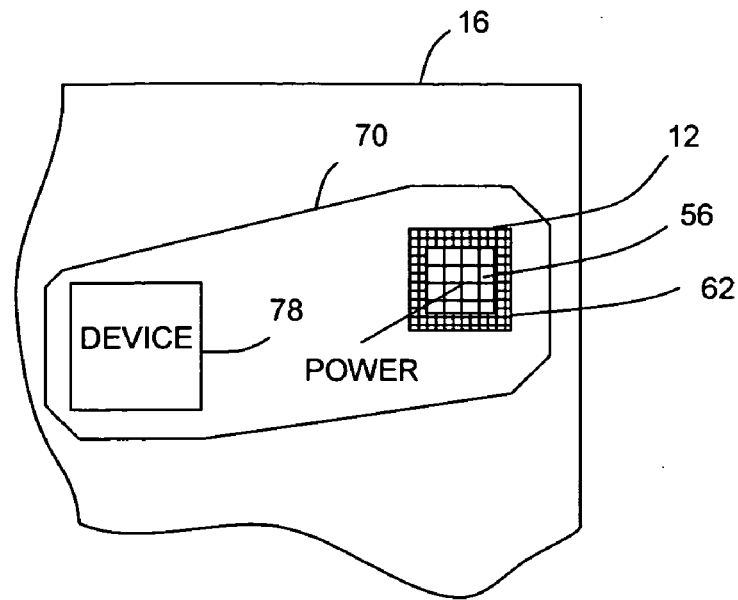
FIG. 3 shows a fragmented top view of the electronic assembly of FIG. 2 in accordance with one embodiment of the present invention.
Figure 4:
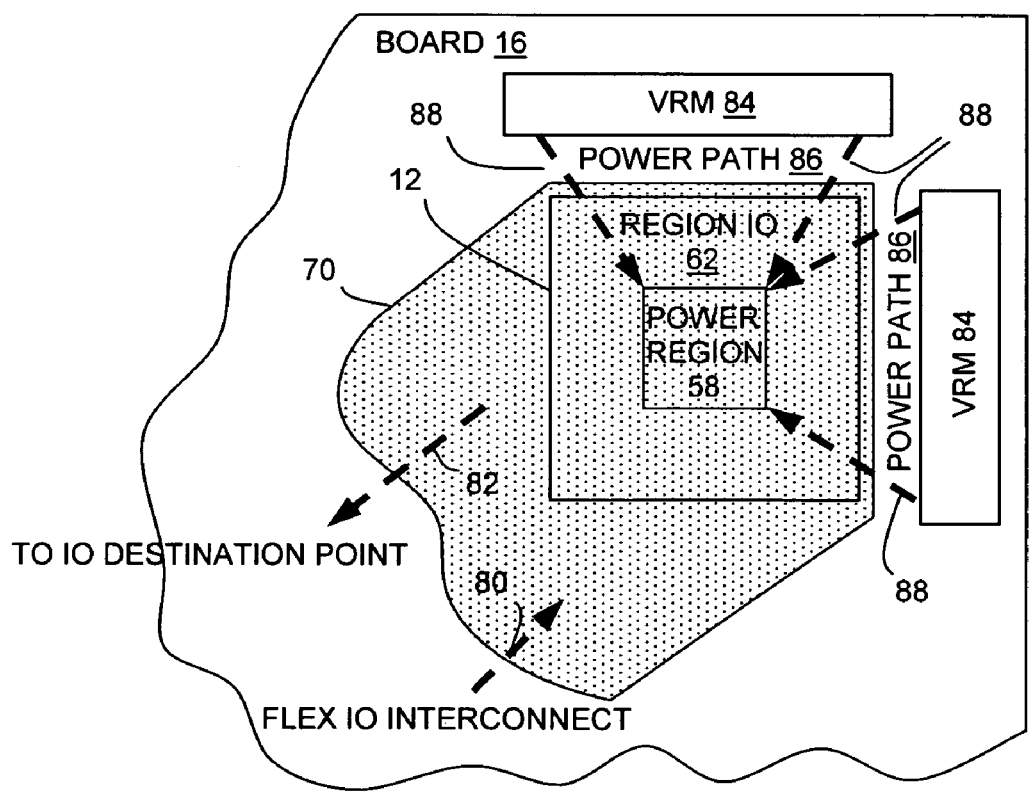
FIG. 4 is shows an enlarged fragmented top view of the electronic assembly of FIG. 2 in accordance with one embodiment of the present invention.

Referring to FIGS. 2, 3 and 4, to incorporate the thin board 70, a plurality of solder joints 72 (taking the place of the solder ball 28) are used in the I/O delivery region 62 between the block 30 (socket or IC package) and the PCB 16, so as to electrically connect the plurality of land pads 32 located in the I/O delivery region 62 to the thin board 70. In this illustrative example, the dividing line between the I/O delivery region 62 and the second power delivery zone 58 is shown by an illustrative dividing line 73 in FIG. 2. Placement of the I/O signal paths on the periphery of the block 30 may facilitate the use of the thin board 70 for the I/O signal paths. The thin board 70 may include a dielectric layer 74 with traces 76 being formed thereon, with such traces forming a bus. The thin board 70 may be particularly useful for high-speed signaling interconnects. Although the thin board 70 may be used to interface with both the power paths 52 and the I/O signal paths 54, the thin board may be particularly useful in interfacing with the I/O connectors 54, since they are conveniently assembled in the peripheral I/O delivery region 62. As previously mentioned, only part of the I/O signal paths may be diverted to the thin board 70. This arrangement of incorporating the thin board 70 with the PCB 16 may allow for a good transition between two board technologies, one relatively inexpensive and low quality (PCB 16) and one relatively expensive and high quality (thin board 70). It should be noted that one advantage of using the thin board 70 is that the pin assignments (pins 20) remain the same, regardless of whether or not the thin board 70 is used. Hence, a good integration of two board technologies may be achieved.

Referring to FIG. 3, the thin board 70 is shown forming a communications path, i.e., bus, between the IC package 12 and a device 78. The IC package 12 may include a processor chip, with the thin board 70 forms a high speed bus for I/O signals between the IC package 12 and the device 78. The device 78 may comprise a number of high speed devices, such as a chipset, another processor, an I/O module, a memory and like devices. In FIG. 3, the PCB 16 with the IC package 12 mounted thereon is shown with the first power delivery zone 56, along with the surrounding I/O delivery region 62, being visible.

Use of the thin board 70 may narrow the total I/O interconnect path of the I/O signal paths, thereby minimizing crosstalk and skew. Additionally, use of the thin board 70 may have an additional advantage of providing good routing ability in pin-out or ball-out areas, as the case may be, of the IC package 12. Additionally, there may be power delivery system gains of using thin board 70, due to all board layers of PCB 16 being free up and available for routing the power.

Referring to FIG. 4, there is shown an enlargement of a portion of FIG. 2 showing the thin board 70 connecting with the IC package 12, with I/O signal paths for signals to the package 12 being shown by an arrow 80 and from the package 12 by an arrow 82. Additionally, a pair of multi-phase voltage regulators (VRMs) 84 may be mounted on the PCB 16. Power paths 86 from the VRMs 84 are shown by arrows 88, which are shown converging toward the second power delivery zone 58. The power paths 86 may first pass through the layers in the PCB 16, then through the first power delivery zone (not shown in this FIG. 4), and then through the second power zone 58. Each of the VRMs 84 comprise a DC voltage regulator which may convert an input DC voltage to either a higher or a lower DC output voltage. The VRMs 84 may allow the electronic assembly 10 of FIG. 1 to support components that are powered by different supply voltages, which may help control power consumption in the overall system. More specifically, the each of the VRMs 84 may comprise a multiphase switching regulator. Multiple phases may be used to increase the available output current of the VRM 84. Each phase may be generated by a switchable solid-state power circuit (not shown) that may feed an inductive element (not shown), which in turns feeds the common node, e.g., the first power delivery zone 56 (see FIG. 1). Such switches rapidly closed and opened to transfer energy between an input power supply (not shown) and the inductive element. A controller (not shown), using feedback, may be used to correctly time the activation and deactivation of each phase, i.e. the closing and opening of the solid state switch for each phase, relative to the others, so that the desired voltage appears at the common node. Another energy storage or filter circuit (e.g., capacitors 42 and 66) is connected to the common node (e.g., first power delivery zone 56). The switching causes an unavoidable ripple in the output current and the output voltage at the common node. The capacitors 42 and 66 help reduce this ripple, in an effort to obtain an essentially DC voltage.

Referring to FIG. 1, in the case where the chip 14 is a microprocessor, a large number of the paths may be dedicated to power and ground, i.e., power/ground paths 52 due to the high power and high current needs. For example, with one illustrative microprocessor chip, there may be an array of 775 paths, with the paths including about 225 power paths and 225 ground paths (dedicated to current supply and return) and about 260 I/O signal paths for I/O data signals. Within the first and second power delivery zones 56 and 58, the configuration and alignment of the paths for supply voltage and ground, both being identified as "power/ground paths", may be arranged in adjacent pairs of power and ground paths in that such pairs may provide better electrical performance, such as common mode noise reduction, to enhance signal integrity performance.

Figure 5:
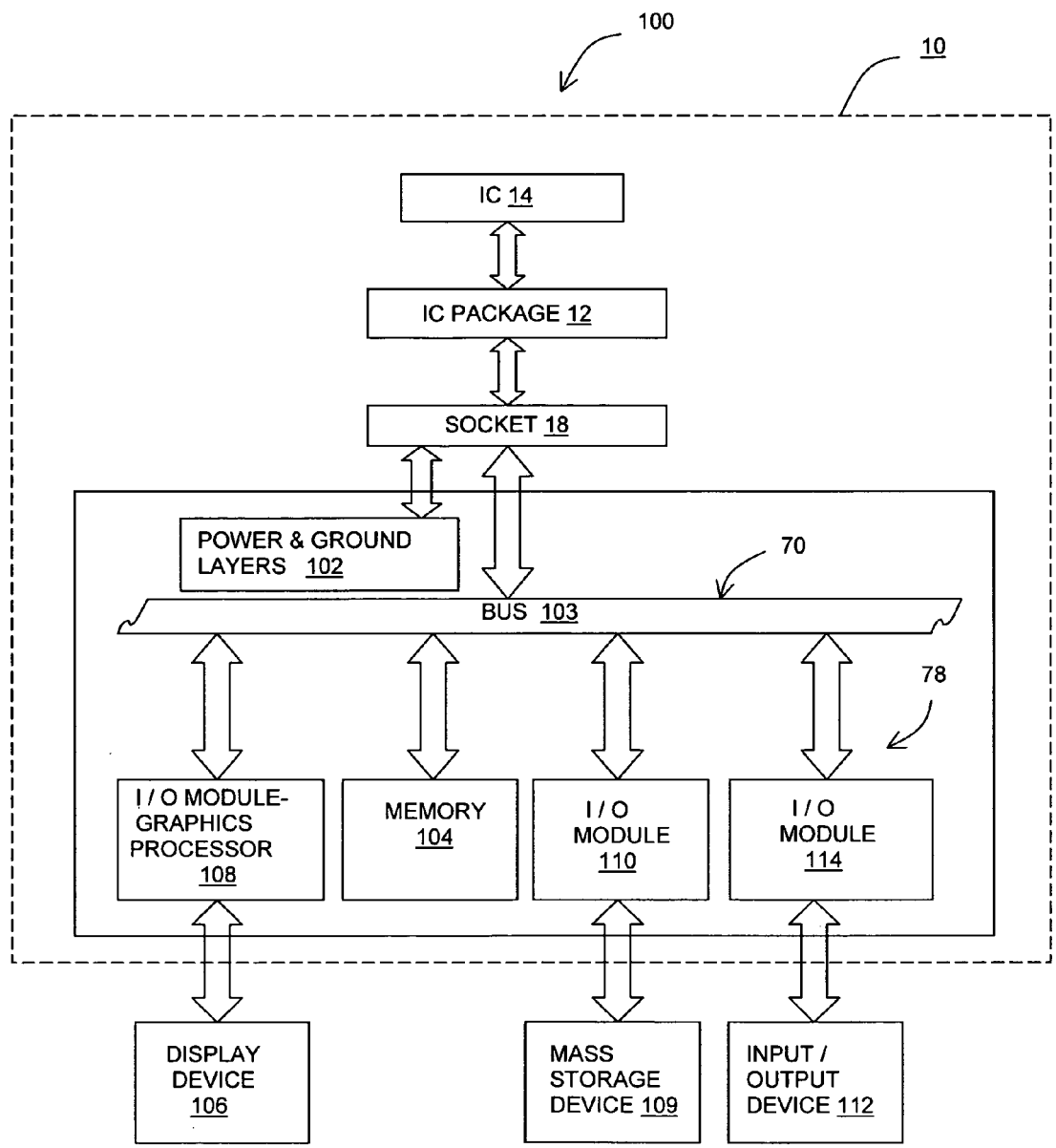
FIG. 5 is a block diagram of a system incorporating the electronic assembly of FIG. 2 in accordance with one embodiment of the present invention.

Referring to FIG. 5, there is illustrated system 100, which is one of many possible systems in which the electronic assembly 10 may be used. In this illustrative system 100, the chip 14, which is mounted in the IC package 12, may be a microprocessor and PCB 16 may be a motherboard, with the socket 18 interconnecting the IC package 12 with the PCB 16 and the thin board 70. In this embodiment, the power/ground paths of the socket 18 may be coupled to the power and ground layers or planes 102 in the PCB 16. The I/O signal paths may be coupled to a bus 103 formed by traces on the thin board 70. The bus 103 interconnects socket 18 (and therefore the microprocessor) with one of more devices 78, which is mounted on the PCB 16 but not electrically interconnected through the PCB 16. The I/O signals on the bus 103 may include data, address, control and/or other low current/slow signals, including direct access memory signals.

In this illustrative embodiment, the devices 78 may include a main memory 102 and a plurality of input/output (I/O) modules for external devices or external buses, all coupled to each other by the bus 103. More specifically, the system 100 may include a display device 106 coupled to a bus on the bus 103 by way of an I/O module 108, with the I/O module 108 having a graphical processor and a memory. The system 100 may further include a mass storage device 109 coupled to the bus 103 via an I/O module 110. Another I/O device 112 may be coupled to the bus 103 via the I/O module 114. Additional I/O modules may be included for other external or peripheral devices or external buses. Examples of the memory 104 include, but are not limited to, static random access memory (SRAM) and dynamic random access memory (DRAM). The memory 104 may include an additional cache memory. Examples of the mass storage device 109 include, but are not limited to, a hard disk drive, a compact disk drive (CD), a digital versatile disk driver (DVD), a floppy diskette, a tape system and so forth. Examples of the input/output devices 110 may include, but are not limited to, devices suitable for communication with a computer user (e.g., a keyboard, cursor control devices, microphone, a voice recognition device, a display, a printer, speakers, and a scanner) and devices suitable for communications with remote devices over communication networks (e.g., Ethernet interface device, analog and digital modems, ISDN terminal adapters, and frame relay devices). In some cases, these communications devices may also be mounted on the PCB 16. The bus 103 may include a single bus or as a combination of buses (e.g., system bus with expansion buses). Examples of the bus system 103 include, but are not limited to, a Peripheral Component Interconnect-X (PCI-X) bus, peripheral control interface (PCI) bus, and Industry Standard Architecture (ISA) bus, and so forth. Depending upon the external device, I/O modules internal interfaces may use programmed I/O, interrupt-driven I/O, or direct memory access (DMA) techniques for communications over the bus 104. Depending upon the external device, external interfaces of the I/O modules may provide to the external device(s) a point-to point parallel interface (e.g., Small Computer System Interface—SCSI) or point-to-point serial interface (e.g., EIA-232) or a multipoint serial interface (e.g., FireWire).

In various embodiments, the system 100 may take the form of a tablet PC, a notebook PC, a desktop computer, a server, a pocket PC, a wireless mobile or cellular phone, a pager, a portable phone, a one-way or two-way radio, a personal digital assistant, a set-top box, an entertainment unit, a DVD player, a medical device, an internet appliance and so forth.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An apparatus, comprising:
   an integrated circuit (IC) package including a chip carrier and a chip mounted to the chip carrier;
   the chip carrier having a pair of opposed surfaces including a chip-facing surface adjacent to the chip and a land surface having a plurality of land-side contacts; a centrally located power delivery region and a peripherally located input-output (I/O) delivery region disposed in partially surrounding relationship to the power delivery region, with the power and I/O delivery regions extending from the chip-facing surface to at least the plurality of land-side contacts;

a plurality of power and ground paths disposed in the power delivery region and a plurality of I/O signal paths disposed in the I/O delivery region; and wherein the chip carrier further includes a decoupling capacitor electrically coupled between the power and the ground paths and positioned in the power delivery region, with the decoupling capacitor being embedded in the chip carrier and positioned to divide the power delivery region into a first and a second power delivery zone.

2. The apparatus according to claim 1, wherein the power and ground paths include a plurality of first power segments and first ground path segments respectively, with each of the first segments extending between some of the land-side contacts and the decoupling capacitor in the first power delivery zone; and the power and ground paths further include a plurality of second power segments and second ground path segments respectively, with each of the second segments extending between the chip-facing surface and the decoupling capacitor in the second power delivery zone.

3. The apparatus according to claim 1, wherein the chip-facing surface includes a plurality of chip-side contacts; the chip is electrically coupled to the chip-side contacts; and each of the power, ground and I/O signal paths includes one of the chip-side contacts and one of the land-side contacts.

4. The apparatus according to claim 3, wherein the power delivery region includes a first and a second power delivery zone; the first power delivery zone extends from some of the land-side contacts to the decoupling capacitor and the second power delivery zone extends from the decoupling capacitor to the chip-facing surface; the power and ground paths include a plurality of first power and first ground path segments with each of the first segments being coupled at one end to one of the land side-contacts and at the other end to the decoupling capacitor; and the power and ground paths further include a plurality of second power and second ground path segments with each of the second segments being coupled at one end to decoupling capacitor and at the other end to one of the chip contacts.

5. The apparatus according to claim 4, wherein the decoupling capacitor includes a conductive power layer, a conductive ground layer and a dielectric layer interposed between the power layer and the ground layer; the first and second power path segments are electrically coupled to the power layer; and the first and second ground path segments are electrically coupled to the ground layer of the decoupling capacitor.

6. The apparatus according to claim 1, further comprising a printed circuit board electrically coupled to at least some of the power and ground paths on the land surface of the IC package; a flexible thin board electrically coupled to at least some of the I/O signal paths on the land surface of the IC package; the printed circuit board including a first dielectric material and the flexible thin board including a second dielectric material; the second dielectric material being more homogeneous than the first dielectric material.

7. The apparatus according to claim 1, further comprising a printed circuit board and a socket mounted between the chip carrier and the printed circuit board and wherein the power paths, ground paths and I/O signal paths are extend through the socket.

8. The apparatus according to claim 7, wherein the first power delivery zone further includes a center portion of the socket and the I/O delivery region further includes a peripheral portion of the socket surrounding the center portion of the socket, the power and ground paths further includes a first plurality of socket connectors in the center region aligned and configured to engage the land-side contacts of the IC package in the first power delivery zone and the I/O signal paths further including a second plurality of socket connectors in the peripheral portion aligned and configured to engage the land-side contacts of the IC package in the I/O delivery zone.

9. The apparatus according to claim 8, wherein the chip, the chip carrier, the decoupling capacitor, the power delivery region and the I/O delivery region, and the socket are centered on a common axis.

10. The apparatus according to claim 9, wherein each of the land-side contacts comprises a pin protruding from the land surface and each of the chip-side contacts comprises a chip-side pad.

11. The apparatus according to claim 9, wherein each of the land-side contacts comprises a land-side pad and each of the chip-side contacts comprises a chip side pad.

12. An apparatus, comprising:
an integrated circuit (IC) package including a chip carrier and a chip mounted in the chip carrier; and the chip carrier including:
a pair of opposed surfaces including a chip-facing surface adjacent to the chip and a land surface;
a plurality of power and ground paths disposed in a centrally located power delivery region of the chip carrier and a plurality of input/output (I/O) signal paths disposed in a peripherally located I/O delivery region of the chip, with the power and I/O delivery regions extending from the chip-facing surface to at least the plurality of land-side contacts; and
a decoupling capacitor embedded in the chip carrier and interposed between the chip-facing surface and the land surface to divide the power delivery region into a first and a second power delivery zone, with the decoupling capacitor being electrically coupled between the power and ground paths.

13. The apparatus according to claim 12, wherein the chip-facing surface includes a plurality of chip-side contacts; the chip is electrically coupled to the chip-side contacts; and each of the power, ground and I/O signal paths includes one of the chip-side contacts and one of the land-side contacts.

14. The apparatus according to claim 13, wherein the first power delivery zone extends from some of the land-side contacts to the decoupling capacitor and the second power delivery zone extends from the decoupling capacitor to the chip-facing surface; the power and ground paths include a plurality of first power and first ground path segments with each of the first segments being coupled at one end to one of the land-side contacts and at the other end to the decoupling capacitor; and the power and ground paths further include a plurality of second power and second ground path segments with each of the second segments being coupled at one end to decoupling capacitor and at the other end to one of the chip contacts.

15. The apparatus according to claim 14, wherein the decoupling capacitor includes a conductive power layer, a conductive ground layer and a dielectric layer interposed between the power layer and the ground layer; the first and second power path segments are coupled to the power layer; and the first and second ground path segments are coupled to the ground layer.

16. The apparatus according to claim 15, wherein the chip, the decoupling capacitor, the first power delivery zone, and the second power delivery zone are centered on a common axis; and a first cross section of the first power delivery zone is larger than a second cross section of the second power delivery zone, with the first and second cross-sections being perpendicular to the common axis.

17. The apparatus according to claim 12, wherein the power and ground paths include a plurality of first power segments and first ground path segments respectively, with each of the first segments extending between some of the land-side contacts and the decoupling capacitor in the first power delivery zone; and the power and ground paths further include a plurality of second power segments and second ground path segments respectively, with each of the second segments extending between the chip-facing surface and the decoupling capacitor in the second power delivery zone.

18. The apparatus according to claim 17, further comprising a printed circuit board electrically coupled to at least some of the power and ground paths on the land surface of the IC package; a flexible thin board electrically coupled to at least some of the I/O signal paths on the land surface of the IC package; the printed circuit board including a first dielectric material and the flexible thin board including a second dielectric material; the second dielectric material being more homogeneous than the first dielectric material.

19. The apparatus according to claim 17, further comprising a printed circuit board and a socket mounted between the chip carrier and the printed circuit board and wherein the power paths, ground paths and I/O signal paths are extend through the socket.

20. The apparatus according to claim 19, wherein the first power delivery zone further includes a center portion of the socket and the I/O delivery region further includes a peripheral portion of the socket surrounding the center portion of the socket; the power and ground paths further includes a first plurality of socket connectors in the center region aligned and configured to engage the land-side contacts of the IC package in the first power delivery zone and the I/O signal paths further including a second plurality of socket connectors in the peripheral portion aligned and configured to engage the land-side contacts of the IC package in the I/O delivery zone.

* * * * *

UNITED STATES PATENT AND TRADEMARK OFFICE
CERTIFICATE OF CORRECTION

PATENT NO. : 7,209,366 B2
APPLICATION NO. : 10/804800
DATED : April 24, 2007
INVENTOR(S) : Prokofiev et al.

It is certified that error appears in the above-identified patent and that said Letters Patent is hereby corrected as shown below:

Column 11
Lines 61-62, "...are extend through..." should read --...are extended through...--

Column 14
Lines 6-7, "...are extend through..." should read --...are extended through...--.

Signed and Sealed this

Seventh Day of October, 2008

JON W. DUDAS
*Director of the United States Patent and Trademark Office*